(12) United States Patent
Neumann et al.

(10) Patent No.: US 9,025,629 B2
(45) Date of Patent: May 5, 2015

(54) HIGH COMPLIANCE LASER DRIVER CIRCUIT

(71) Applicant: Micrel, Inc., San Jose, CA (US)

(72) Inventors: Bernd Neumann, Muellrose (DE); Dieter Kuehnel, Frankfurt (DE); Maik Pohland, Frankfurt (DE)

(73) Assignee: Micrel, Inc., San Jose, CA (US)

( * ) Notice: Subject to any disclaimer, the term of this patent is extended or adjusted under 35 U.S.C. 154(b) by 137 days.

(21) Appl. No.: 13/692,817

(22) Filed: Dec. 3, 2012

(65) Prior Publication Data

US 2014/0153598 A1 Jun. 5, 2014

(51) Int. Cl.
*H01S 3/00* (2006.01)
*H01S 5/042* (2006.01)
*H01S 5/068* (2006.01)

(52) U.S. Cl.
CPC ........... *H01S 5/0427* (2013.01); *H01S 5/06808* (2013.01)

(58) Field of Classification Search
CPC ...... H01S 3/10; H01S 5/0427; H01S 5/06808

USPC ............. 372/38.1, 38.01, 38.02, 38.03, 38.07
See application file for complete search history.

(56) References Cited

U.S. PATENT DOCUMENTS 6,097,159 A * 8/2000 Mogi et al. ..................... 315/151
2007/0153849 A1 * 7/2007 Koren et al. ............... 372/38.02

* cited by examiner

*Primary Examiner* — Yuanda Zhang
(74) *Attorney, Agent, or Firm* — Van Pelt, Yi & James LLP

(57) ABSTRACT

A laser driver circuit having a differential circuit and an output circuit includes a control circuit receiving a regulated supply voltage that also supplies the differential circuit as an input signal. The control circuit generates a feedback voltage across a first resistor to cause a first current to flow in the first resistor having a current value equal or proportional to the modulation current value. The laser driver circuit includes an operational amplifier receiving the feedback voltage and a reference voltage indicative of a desired modulation current value and to generate the regulated supply voltage. The control circuit and the operational amplifier form a feedback control loop to adjust the regulated supply voltage to regulate the feedback voltage to be equal to the reference voltage, thereby regulating the modulation current value to the desired modulation current value.

16 Claims, 4 Drawing Sheets

HIGH COMPLIANCE LASER DRIVER CIRCUIT

BACKGROUND OF THE INVENTION

The invention relates to a driver circuit for a laser diode and, in particular, to a laser driver circuit for a laser diode with improved noise level.

Optical communication systems commonly employ semiconductor lasers or other optical emitters for transmitting light signals indicative of a low data value and a high data value, as represented by different light intensity levels. Semiconductor lasers, such as edge emitting lasers (Distributed Feedback (DFB) lasers and Fabry-Perot lasers) and vertical cavity surface emitting lasers (VCSEL), are well known. Semiconductor lasers or optical emitters may be used to form a fiber optics transmitter or an optical transceiver.

A semiconductor laser, also called a laser diode, requires a bias current above a threshold level applied to the laser to turn the laser on so that lasing can occur. Once the laser is turned on, that is, the bias current is above the threshold level, the laser can transmit data signals (high/low data values) by receiving a data-dependent modulation current which operates to modify the optical power emitted by the laser diode. The two levels (high or low) of the data pattern are usually represented by a large emitted optical power or a small emitted optical power. A laser driver, typically implemented as an integrated circuit, is used to apply the desired bias current and provide the data-dependent modulation current.

Both the laser bias current and the laser modulation current are monitored and adjusted over time to compensate for variations in the average output power level due to laser aging, temperature variations, and other factors. FIG. 1 is a circuit diagram illustrating a conventional laser driver including a feedback control for regulating the laser diode modulation current. In laser driver 10, the input data (IN and INb) is coupled to a differential circuit 20 as the input stage of the laser driver. An output circuit 26 formed by transistors Qout1 and Qout2 configured as a differential pair provides an output signal (OUT and OUTb). In the present description, the output signal is an output modulation current signal coupled to drive the laser diode as a load. The differential pair of transistors Qout1 and Qout2 is biased by a current source formed by a resistor $R_{MOD}$. The voltage $V_{RMOD}$ across the resistor $R_{MOD}$ is regulated to the reference voltage $V_{MOD}$ and the modulation current $I_{MOD}$ is given as $V_{MOD}/R_{MOD}$. In most applications, the resistor $R_{MOD}$ is an integrated on-chip resistor. In that case, the required modulation current $I_{MOD}$ is obtained by selecting a reference voltage $V_{MOD}$ such that the desired modulation current is realized using the fixed value resistor.

To monitor and control the value of the modulation current, a feedback loop is formed where a feedback voltage $V_{FB}$ is taken from the current source resistor $R_{MOD}$ and coupled to an operational amplifier 16. The operational amplifier senses the difference between the feedback voltage $V_{FB}$ and the reference voltage $V_{MOD}$ setting the desired modulation current value. The operational amplifier 16 generates an output signal 18 which is coupled as the positive supply voltage $V_R$ for the differential circuit 20. In other words, the operational amplifier 16 adjusts the positive supply voltage $V_R$ of the differential circuit 20 to adjust the modulation current $I_{MOD}$.

However, because resistor $R_{MOD}$ is connected to the emitter terminals of transistors Qout1 and Qout2 which are moving in accordance with the input data pattern, the voltage $V_{RMOD}$ across the resistor $R_{MOD}$ is not a stable or constant value. Instead, the voltage $V_{RMOD}$ has a data dependent variation where the data pattern is usually a bit pattern at a certain data rate. Because the voltage $V_{RMOD}$ is taken as the feedback voltage $V_{FB}$, the data pattern of the input data influence the feedback loop. As a result, the modulation current $I_{MOD}$ provided at the output terminal 27 is not regulated to a constant value but rather exhibits a data pattern dependency. The data pattern dependency is particularly problematic for low output data values.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In embodiments of the present invention, a laser driver incorporates a data-independent feedback control loop for monitoring and controlling the modulation current delivered to drive a laser diode. More specifically, the feedback control loop is connected through a non-switching feedback path separate from the output stage of the laser driver. The feedback control loop thus constructed eliminates the influence of the input data pattern on the feedback loop and significantly reduces variations in the modulation current, especially for low output data values. The laser driver is thus able to achieve a significant reduction in the low level output voltage noise. By reducing the data pattern dependent output voltage variation, the laser driver of the present invention can be used in applications with increased data rate.

Figure 1:
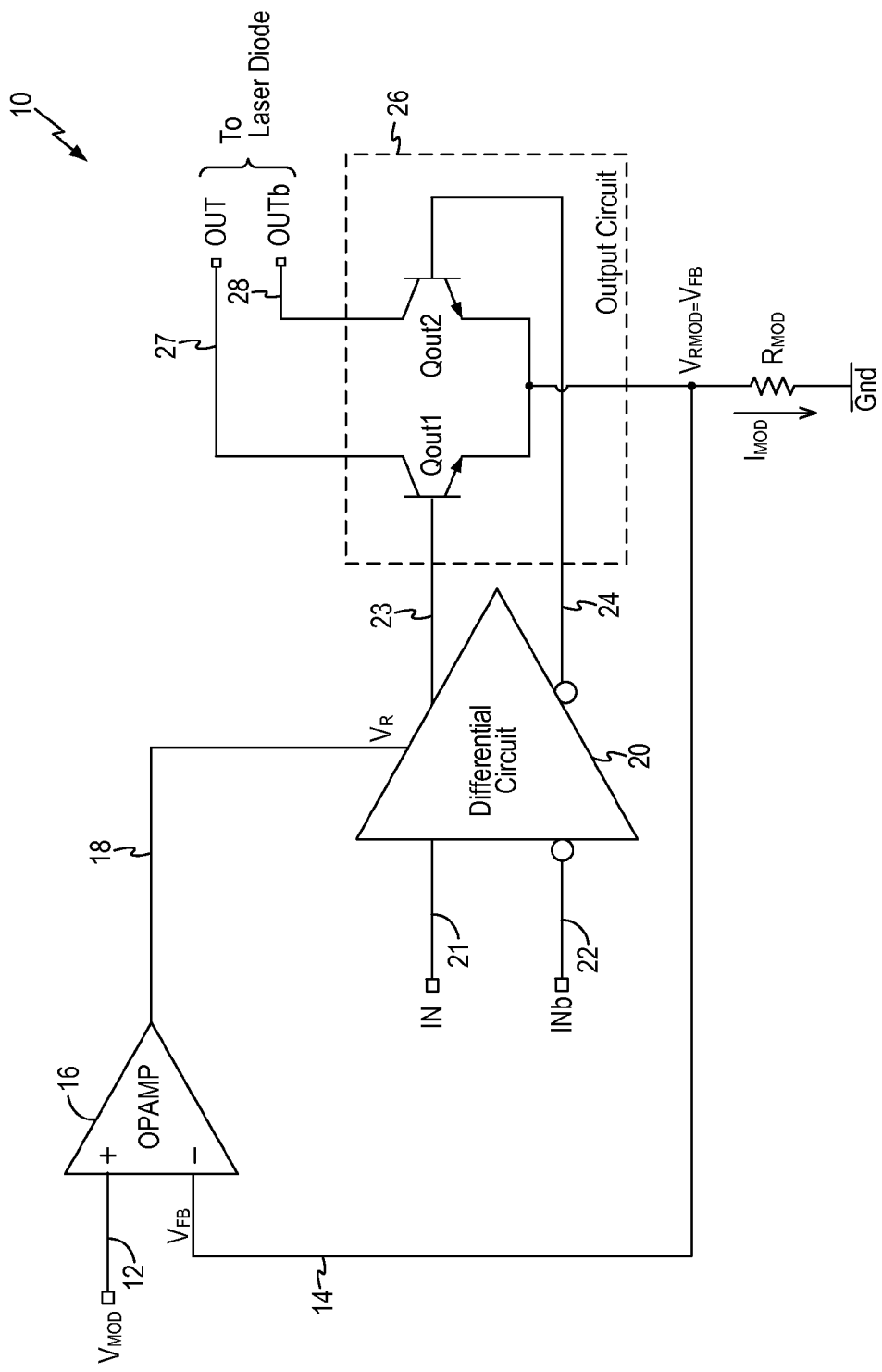
FIG. 1 is a circuit diagram illustrating a conventional laser driver including a feedback control for regulating the laser diode modulation current.
Figure 2:
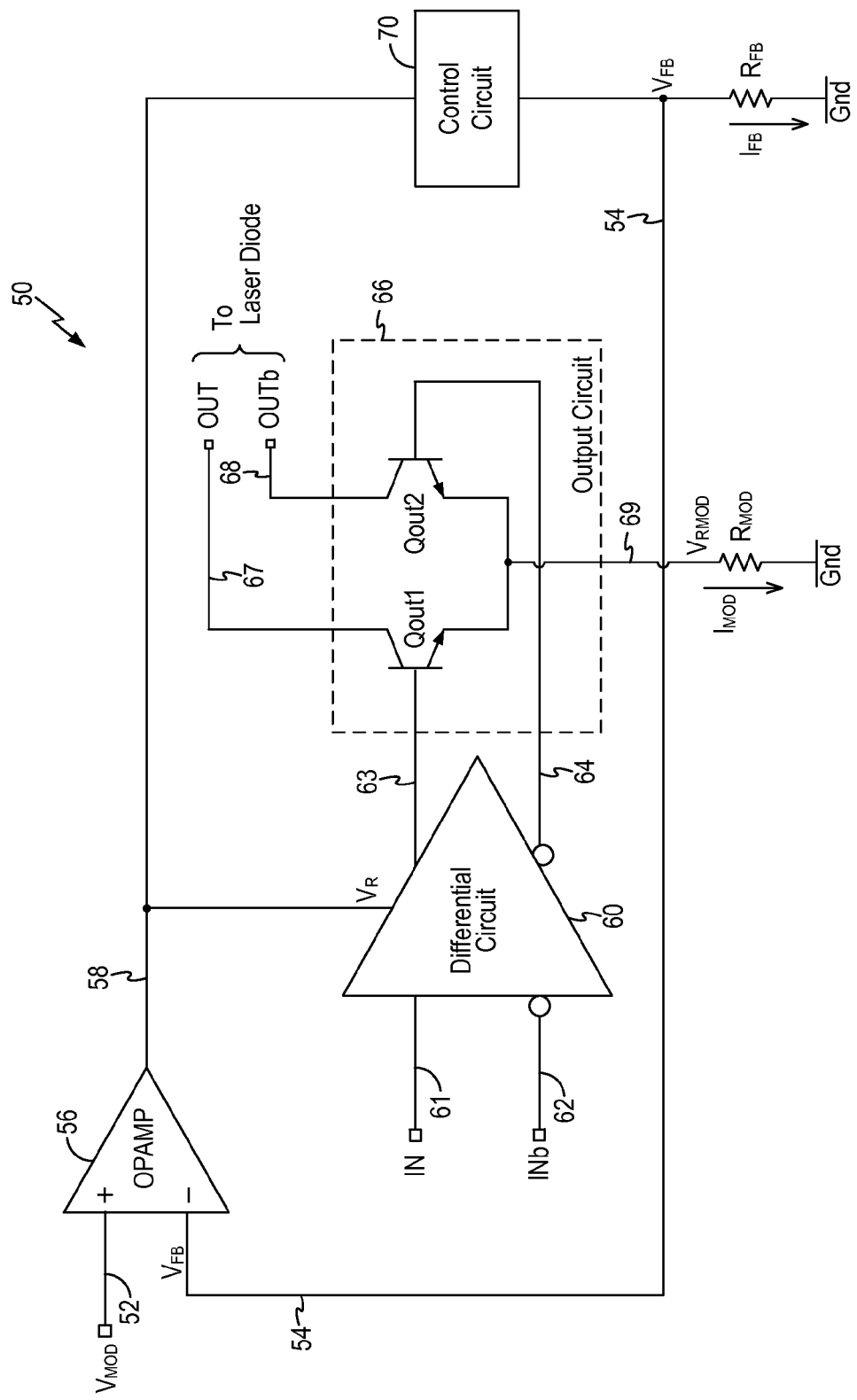
FIG. 2 is a circuit diagram illustrating a laser driver including a data-independent feedback control loop for regulating the laser diode modulation current according to one embodiment of the present invention.

FIG. 2 is a circuit diagram illustrating a laser driver including a data-independent feedback control loop for regulating the laser diode modulation current according to one embodiment of the present invention. Referring to FIG. 2, a laser driver 50 includes a differential circuit 60 as the input stage receiving an input data (IN and INb) and a differential pair as the output stage providing an output signal (OUT and OUTb). In the present description, the output signal is an output modulation current signal coupled to drive the laser diode as a load. More specifically, the input data is a differential input signal IN and INb and is provided to the input terminals 61 and 62 of the differential circuit 60. Differential circuit 60 generates differential output signals on output nodes 63 and 64 for driving the output circuit 66. The differential circuit 60 is supplied by a voltage $V_R$ (node 58) as the positive power supply voltage.

The output circuit 66 is formed by transistors Qout1 and Qout2 configured as a differential pair. The differential pair is biased by a current source formed by a resistor $R_{MOD}$. The resistor $R_{MOD}$ is connected between the emitter terminals (node 69) of transistors Qout1 and Qout2 and a ground potential. The collector terminals of transistors Qout1 and Qout2 provide an output signal (OUT and OUTb) on differential output nodes 67 and 68. In the present description, the output signal is an output modulation current signal coupled to drive the laser diode as a load. In most applications, only the non-inverting output signal OUT (node 67) is used to drive the laser diode to the high and low output levels. For instance, when the input data has a logical high data value, the output signal OUT provides a given modulation current to drive the laser diode to emit at a high optical power level to represent the logical high input data.

A current flowing through the resistor $R_{MOD}$ is the modulation current $I_{MOD}$ provided by the output nodes 67, 68 to drive the laser diode. The modulation current $I_{MOD}$ is given as $V_{RMOD}/R_{MOD}$. As will be described in more detail below, a feedback control loop in laser driver 50 regulates the laser driver circuit so that the voltage $V_{RMOD}$ across the resistor $R_{MOD}$ is equal or proportional to the feedback voltage $V_{FB}$ (i.e., $V_{RMOD}=V_{FB}*X$, where X denotes the proportional factor). When the feedback voltage $V_{FB}$ is regulated to a reference voltage $V_{MOD}$, the voltage $V_{RMOD}$ across the resistor $R_{MOD}$ is also regulated equal or proportional to the reference voltage $V_{MOD}$ and the modulation current $I_{MOD}$ is given as $(V_{MOD}*X)/R_{MOD}$. In most applications, the resistor $R_{MOD}$ is an integrated on-chip resistor. In that case, the required modulation current $I_{MOD}$ is obtained by selecting a reference voltage $V_{MOD}$ such that the desired modulation current is realized using the fixed value resistor.

The laser driver 50 incorporates a feedback control loop to monitor and control the value of the modulation current $I_{MOD}$ to maintain the modulation current at the desired value as set by the reference voltage $V_{MOD}$. In embodiments of the present invention, the laser driver 50 incorporates a feedback control loop that is separated from the switching output circuit 66. Accordingly, the feedback control loop operates independently of the data pattern of the input data. In the present embodiment, the feedback control loop in laser driver 50 includes a control circuit 70 connected in series with a resistor $R_{FB}$. The control circuit 70 receives the supply voltage $V_R$ (node 58) as an input signal and causes a current $I_{FB}$ to flow in resistor $R_{FB}$ so that the feedback voltage $V_{FB}$ (node 54) develops across the resistor $R_{FB}$. Importantly, the control circuit 70 generates the current $I_{FB}$ flowing in resistor $R_{FB}$ so that current $I_{FB}$ is equal or proportional to the modulation current $I_{MOD}$ flowing in resistor $R_{MOD}$. As a result, the feedback voltage $V_{FB}$ tracks the voltage $V_{RMOD}$ across the resistor $R_{MOD}$. Control circuit 70 can be implemented in many ways to generate a current $I_{FB}$ that is equal or proportional to the modulation current $I_{MOD}$.

The feedback voltage $V_{FB}$ across the resistor $R_{FB}$ is coupled to the inverting input terminal of an operational amplifier 56. The operational amplifier 56 receives the reference voltage $V_{MOD}$ on its non-inverting input terminal where the reference voltage $V_{MOD}$ sets the desired modulation current value. The operational amplifier 56 senses the difference between the feedback voltage $V_{FB}$ and the reference voltage $V_{MOD}$ and generates an output signal $V_R$ (node 58) which is coupled to the differential circuit 60 as a regulated supply voltage of the differential circuit. In this manner, the operational amplifier 56 adjusts the regulated supply voltage $V_R$ of the differential circuit 60 to adjust the modulation current $I_{MOD}$ at the output nodes 67, 68 to the desired level. The output signal $V_R$ is also coupled as an input signal to the control circuit 70 to form the feedback control loop. At control circuit 70, changes in the output signal $V_R$ are reflected in the current $I_{FB}$ flowing in resistor $R_{FB}$ and in the feedback voltage $V_{FB}$. The feedback voltage $V_{FB}$ is coupled back to the operational amplifier 56 to complete the feedback control loop where the feedback voltage $V_{FB}$ is regulated to the reference voltage $V_{MOD}$. Because the current $I_{FB}$ is equal or proportional to the current $I_{MOD}$, when current $I_{FB}$ is regulated based on the feedback voltage $V_{FB}$, the modulation current $I_{MOD}$ is thereby regulated to the desired current value as the voltage across resistor $R_{MOD}$ is regulated in relation to the reference voltage $V_{MOD}$.

As thus configured, the laser driver 50 is able to regulate the modulation current provided at the output nodes 67, 68 using a feedback control loop that is separated from the output circuit 66 and therefore, the feedback voltage $V_{FB}$ is isolated from noise associated with the switching action of the output signal. Thus, the feedback control loop in laser driver 50 can regulate the modulation current with significantly reduced noise introduced due to the switching of the input data.

Figure 3:
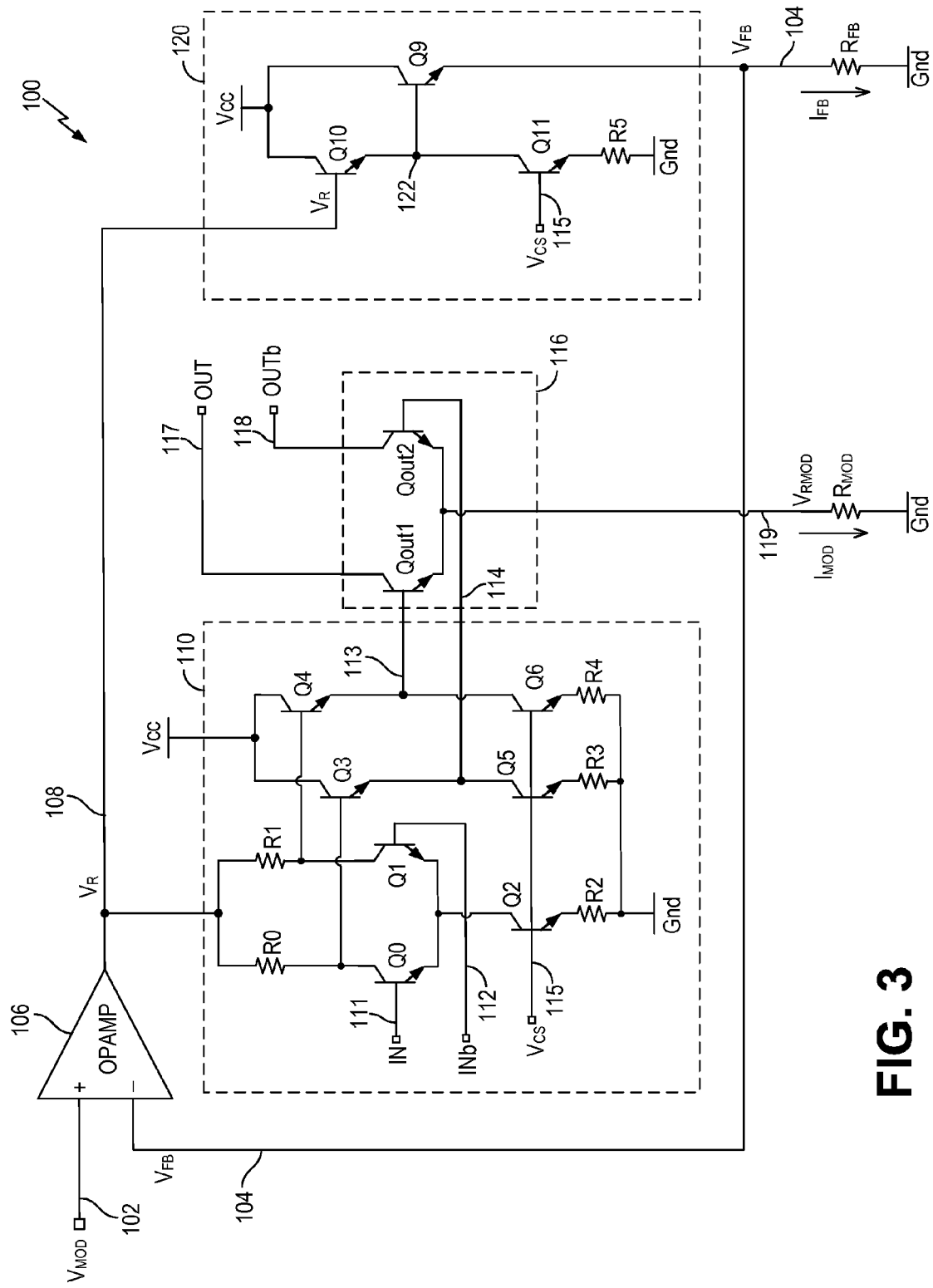
FIG. 3 illustrates a transistor level implementation of the laser driver of FIG. 2 according to one embodiment of the present invention.

FIG. 3 illustrates a transistor level implementation of the laser driver of FIG. 2 according to one embodiment of the present invention. The laser driver circuit 100 in FIG. 3 is constructed in a similar manner as the laser driver 50 in FIG. 2 and like elements are given like reference numerals and will not be further described. In particular, FIG. 3 illustrates the transistor level implementation for the differential circuit 110, the output circuit 116 and the control circuit 120. The construction and operation of the differential circuit 110 and output circuit 116 are conventional and well known and will not be described in detail. In brief, the differential circuit 110 is constructed of a differential amplifier formed by transistors Q0 and Q1 and an output stage formed by transistors Q3 and Q4. Transistors Q2, Q5 and Q6, biased by a bias signal $V_{CS}$ (node 115), with resistors R2, R3, and R4 form the current sources for the differential amplifier and the output stage. The output circuit 116 is constructed of a differential pair of transistors Qout1 and Qout2 biased a current source formed by resistor $R_{MOD}$.

The control circuit 120 forming the data-independent feedback control loop of the laser driver 100 includes NPN bipolar transistors Q10 and Q11 and a resistor R5 connected in series between a positive power supply voltage Vcc and the ground potential. Transistor Q10 receives the voltage $V_R$ at its base terminal while transistor Q11 receives the bias signal $V_{CS}$ (node 115) at its base terminal. The control circuit 120 further includes an NPN bipolar transistor Q9 having the collector terminal connected to the positive power supply voltage Vcc and the emitter terminal (node 104) connected to the resistor $R_{FB}$. The base terminal (node 122) of transistor Q9 is connected to the emitter terminal of transistor Q10 which is also the collector terminal of transistor Q11.

FIG. 3 illustrates one exemplary implementation of the control circuit 120 for generating a current $I_{FB}$ that is equal or proportional to the modulation current $I_{MOD}$. In the present embodiment, the control circuit 120 duplicates part of the circuitry of the differential circuit 110 and the output circuit 116 so that the control circuit 120 generates a current $I_{FB}$ flowing in resistor $R_{FB}$ being equal or proportional to the modulation current $I_{MOD}$ flowing in resistor $R_{MOD}$. Accordingly, the feedback voltage $V_{FB}$ across resistor $R_{FB}$ tracks the voltage $V_{RMOD}$ across the resistor $R_{MOD}$. In particular, in the present embodiment, transistor Q10 correlates with transistor Q4 (or Q3) of the differential circuit 110, transistor Q11 correlates with transistor Q6 (or Q5) of the differential circuit, and resistor R5 correlates with resistor R4 (or R3) of the differential circuit. Finally, transistor Q9 correlates with transistor Qout1 (or Qout2) of the output circuit 116. Transistor Q6, driven by the bias signal $V_{CS}$, and resistor R4 form a current source for biasing transistor Q4. Similarly, transistor Q5, driven by the bias signal $V_{CS}$, and resistor R3 form a current source for biasing transistor Q3. In control circuit 120, transistor Q11, driven by the bias signal $V_{CS}$, and resistor R5 form a current source similar to that of transistor Q6/resistor R4 (or transistor Q5/resistor R3) for biasing transistor Q10.

The control circuit 120 duplicates part of the differential circuit and part of the output circuit to simulate these circuit elements with the input signal at a fixed signal level. That is, assuming the input data is high, the input signal INb is low and transistor Q1 is turned off. The base terminal of transistor Q4 is thus driven to the regulated supply voltage $V_R$. Transistor Q10, duplicating the operating condition of transistor Q4, has its base terminal connected to the regulated supply voltage $V_R$. Transistor Q9 simulates the output transistor Qout1. However, because the control circuit 120 is not connected to the input data, the switching of the input data does not impact the operation of the control circuit 120. The emitter node of transistor Q9 (node 104) does not move or drift due to the input data pattern. The feedback voltage $V_{FB}$ at the emitter node of transistor Q9 is thus isolated from input data pattern noise that may be present at the emitter node of transistor Qout1.

In one embodiment, the transistor sizes and the resistance values of the control circuit 120 is selected to be the same as their corresponding elements in the differential circuit 110 and the output circuit 116. Furthermore, resistor $R_{FB}$ is selected to have the same resistance value as resistor $R_{MOD}$. In that case, the voltage at the emitter terminal (node 104) of transistor Q9 is the same as the voltage at the emitter terminal (mode 119) of transistor Qout1 (but without input data pattern noise). Thus, $V_R - V_{RMOD} = V_R - V_{FB}$. Accordingly, the control circuit 120 ensures that the voltage across resistor $R_{FB}$ is the same as the voltage across resistor $R_{MOD}$. Thus, $V_{FB} = V_{RMOD}$. As a result, current $I_{FB}$ has the same current value as the modulation current $I_{MOD}$. Through the operation of the feedback control loop, the operational amplifier 106 adjusts the regulated supply voltage $V_R$ to the differential circuit 110 and to the control circuit 120 so that $V_{FB} = V_{MOD}$. Because $V_{FB} = V_{RMOD}$, the feedback control loop regulates the modulation current $I_{MOD}$ through resistor $R_{MOD}$ so that $V_{RMOD} = V_{FB} = V_{MOD}$. Importantly, because the feedback voltage $V_{FB}$ used in the feedback control loop is generated independently of the switching output circuit, the feedback voltage $V_{FB}$ does not suffer from any data pattern noise. The noise level in the output signal OUT and OUTb of the laser driver, particularly for low output voltage level, is significantly reduced.

Using the same transistor sizing and resistance values in the control circuit 120 and resistor $R_{FB}$ realizes the best possible tracking of the feedback voltage $V_{FB}$ to the voltage $V_{RMOD}$. However, the laser driver circuit 100 will have twice the modulation current flow through the circuit. In other embodiments, the control circuit 120 may be constructed using circuit elements with transistors sizes and element values, such as resistance, that are not the same as the differential circuit 110 and output circuit 116. Also, the resistor $R_{FB}$ may have a different resistance value as resistor $R_{MOD}$. For the feedback control loop to operate as desired, it is only necessary that current $I_{FB}$ is equal or proportional to the modulation current $I_{MOD}$. Therefore, the transistor sizing and resistance values of the control circuit 120 and resistor $R_{FB}$ can be selected to have any values as long as the current $I_{FB}$ is equal or proportional to the modulation current $I_{MOD}$.

In one embodiment, the transistor sizing and resistance values of the control circuit 120 and resistor $R_{FB}$ are selected so that they are proportional to but a portion of their corresponding circuit elements. In that case, the control circuit 120 generates a current $I_{FB}$ that is proportional to but a fraction of the modulation current $I_{MOD}$.

Figure 4:
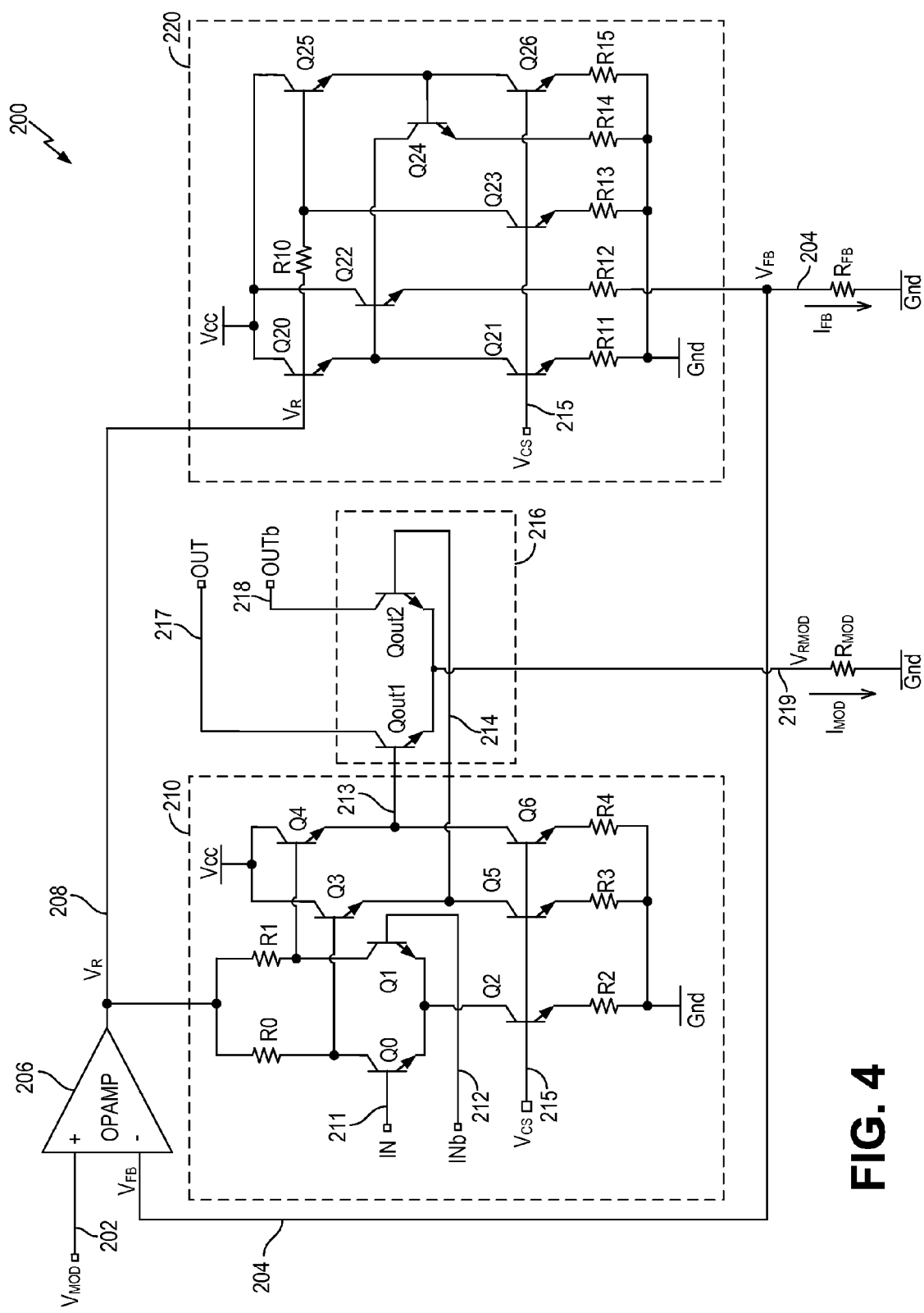
FIG. 4 illustrates a transistor level implementation of the laser driver of FIG. 2 according to an alternate embodiment of the present invention.

FIG. 4 illustrates a transistor level implementation of the laser driver of FIG. 2 according to an alternate embodiment of the present invention. The laser driver circuit 200 in FIG. 4 is constructed in a similar manner as the laser driver 100 in FIG. 3 and like elements are given like reference numerals and will not be further described. In particular, FIG. 4 illustrates an alternate embodiment of the control circuit 220 which generates a current $I_{FB}$ that is proportional to but not the same as the modulation current $I_{MOD}$ and incorporates compensation circuitry to ensure that the feedback voltage $V_{FB}$ tracks the voltage $V_{RMOD}$ across process, supply voltage and temperature variations.

More specifically, control circuit 220 is constructed using transistor sizing and resistance values that are not identical to the corresponding circuit elements in the differential circuit 210 or the output circuit 216. Furthermore, in the present embodiment, the resistor $R_{FB}$ can have the same or a different resistance value as resistor $R_{MOD}$. For instance, transistors Q20, Q21 and Q22 may have transistor sizing that is not the same as or not proportional to the corresponding transistors (e.g. Q4, Q6, Qout1) in differential circuit 210 and the output circuit 216. When the control circuit 220 does not use identical or proportional transistor sizing and resistance values, the feedback voltage $V_{FB}$ may not track the voltage $V_{RMOD}$ well, particularly over process, supply voltage and temperature variations. In embodiments of the present invention, control circuit 220 includes circuit elements for providing compensation to ensure that the feedback voltage $V_{FB}$ tracks the voltage $V_{RMOD}$ over process, supply voltage and temperature variations. In one embodiment, the compensation circuit includes transistors Q23 to Q26 and resistors R10 and R12-R15. Other implementations of the compensation circuit are possible.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A laser driver circuit configured to receive a data input signal and to generate an output modulation current signal indicative of the data input signal, the laser driver circuit including a differential circuit configured to receive the data input signal and an output circuit configured to generate the output modulation current signal having a given modulation current value, the differential circuit being supplied by a regulated supply voltage, the laser driver circuit comprising:
   a control circuit having an input node configured to receive the regulated supply voltage as an input signal and having an output node connected to a first resistor, the control circuit being configured to generate a feedback voltage across the first resistor to cause a first current to flow in the first resistor having a current value equal or proportional to the modulation current value; and
   an operational amplifier configured to receive the feedback voltage and a reference voltage indicative of a desired modulation current value and to generate the regulated supply voltage supplying the differential circuit,
   wherein the control circuit and the operational amplifier form a data-independent feedback control loop separate from the output circuit generating the output modulation current to adjust the regulated supply voltage so as to regulate the feedback voltage to be equal to the reference voltage, thereby regulating the modulation current value to the desired modulation current value independent of a data pattern of the data input signal.

2. The laser driver circuit of claim 1, wherein the feedback voltage is isolated from noise associated with the switching action of the output modulation current signal.

3. The laser driver circuit of claim 1, wherein the control circuit is configured to generate the feedback voltage across the first resistor to cause the first current to have a current value being the same as the modulation current value, the first current tracking changes in the modulation current value.

4. The laser driver circuit of claim 1, wherein the control circuit is configured to generate the feedback voltage across the first resistor to cause the first current to have a current value being a fraction of the modulation current value, the first current tracking changes in the modulation current value.

5. The laser driver circuit of claim 1, wherein the output circuit comprises a differential pair biased by a current source, the current source providing the modulation current value, a first voltage indicative of the modulation current value being developed across the current source, and wherein the control circuit is configured to generate the feedback voltage across the first resistor being proportional to the first voltage.

6. The laser driver circuit of claim 5, wherein the control circuit is configured to generate the feedback voltage across the first resistor having the same voltage value as the first voltage, the feedback voltage tracking changes in the first voltage.

7. The laser driver circuit of claim 5, wherein the control circuit is configured to generate the feedback voltage across the first resistor having a voltage value being a fraction of the first voltage, the feedback voltage tracking changes in the first voltage.

8. The laser driver circuit of claim 5, wherein the current source comprises a second resistor, a current flowing through the second resistor having the modulation current value and a voltage across the second resistor being the first voltage.

9. The laser driver circuit of claim 1, wherein the differential circuit comprises an output stage and the output circuit comprises a differential pair biased by a current source, a first voltage indicative of the modulation current value being developed across the current source, and wherein the control circuit comprises circuitry correlating to a part of the circuitry of the output stage of the differential circuit and a part of the circuitry of the differential pair of the output circuit, the control circuit being configured to generate the feedback voltage across the first resistor being proportional to the first voltage.

10. The laser driver circuit of claim 9, wherein the control circuit comprises circuit elements having the same sizing and element values as the correlating circuitry of the differential circuit and the output circuit.

11. The laser driver circuit of claim 9, wherein the control circuit comprises circuit elements having different sizing and element values as the correlating circuitry of the differential circuit and the output circuit.

12. The laser driver circuit of claim 11, wherein the control circuit further comprises a compensation circuit configured to ensure that the first current flowing in the first resistor has a current value proportional to the modulation current value over process, supply voltage and temperature variations.

13. A method in a laser driver circuit, comprising:
   receiving a data input signal and generating, using a differential circuit and an output circuit, an output modulation current indicative of the data input signal;
   supplying the differential circuit using a regulated supply voltage;
   generating, using a data-independent feedback control loop separate from the output circuit generating the output modulation current, a feedback voltage based on the regulated supply voltage;
   generating a first current based on the feedback voltage and having a current value proportional to the modulation current value;
   comparing the feedback voltage to a reference voltage indicative of a desired modulation current value to generate the regulated supply voltage supplying the differential circuit; and
   adjusting the regulated supply voltage, using the data-independent feedback control loop, so as to regulate the feedback voltage to be equal to the reference voltage, thereby regulating the modulation current value to the desired modulation current value independent of a data pattern of the data input signal.

14. The method of claim 13, wherein the feedback voltage is isolated from noise associated with the switching action of the output modulation current signal.

15. The method of claim 13, wherein generating, using a data-independent feedback control loop separate from the output circuit generating the output modulation current, a feedback voltage based on the regulated supply voltage comprises:
   generating the feedback voltage to cause the first current to have a current value being the same as the modulation current value, the first current tracking changes in the modulation current value.

16. The method of claim 13, wherein generating, using a data-independent feedback control loop separate from the output circuit generating output modulation current, a feedback voltage based on the regulated supply voltage comprises:
   generating the feedback voltage to cause the first current to have a current value being a fraction of the modulation current value, the first current tracking changes in the modulation current value.

* * * * *

UNITED STATES PATENT AND TRADEMARK OFFICE
CERTIFICATE OF CORRECTION

PATENT NO. : 9,025,629 B2  
APPLICATION NO. : 13/692817  
DATED : May 5, 2015  
INVENTOR(S) : Neumann et al.

Page 1 of 1

It is certified that error appears in the above-identified patent and that said Letters Patent is hereby corrected as shown below:

Claims:

In Column 8, Claim 16, Line 57, cancel "generating output modulation current" and substitute --generating the output modulation current--.

Signed and Sealed this
Twenty-first Day of June, 2016

Michelle K. Lee
*Director of the United States Patent and Trademark Office*